United States Patent [19]
Koo

[11] Patent Number: 6,075,264
[45] Date of Patent: Jun. 13, 2000

[54] STRUCTURE OF A FERROELECTRIC MEMORY CELL AND METHOD OF FABRICATING IT

[75] Inventor: Bon-Jae Koo, Inchon-Kwangyokshi, Rep. of Korea

[73] Assignee: Samsung Electronics Co., Ltd., Rep. of Korea

[21] Appl. No.: 09/237,083

[22] Filed: Jan. 25, 1999

[51] Int. Cl.[7] .......................... H01L 29/76; H01L 29/94; H01L 31/062

[52] U.S. Cl. .......................... 257/295; 257/296; 257/300; 257/298; 257/71; 257/750; 257/753; 257/758; 257/763; 257/764

[58] Field of Search .................................. 257/295, 298, 257/750, 753, 758, 763, 764, 71, 296, 300

[56] References Cited

U.S. PATENT DOCUMENTS

| | | | |
|---|---|---|---|
| 4,348,263 | 9/1982 | Draper et al. | 204/29 |
| 4,466,177 | 8/1984 | Chao | 29/571 |
| 5,019,535 | 5/1991 | Wojnarowski et al. | 437/209 |
| 5,046,043 | 9/1991 | Miller et al. | 365/145 |
| 5,066,615 | 11/1991 | Brady et al. | 437/229 |
| 5,074,969 | 12/1991 | Brewer et al. | 205/118 |
| 5,122,477 | 6/1992 | Wolters et al. | 437/60 |
| 5,173,170 | 12/1992 | Brown et al. | 205/96 |
| 5,281,549 | 1/1994 | Fazan et al. | 437/52 |
| 5,335,138 | 8/1994 | Sandhu et al. | 361/303 |
| 5,366,920 | 11/1994 | Yamamichi et al. | 437/52 |
| 5,372,974 | 12/1994 | Doan et al. | 437/240 |
| 5,392,189 | 2/1995 | Fazan et al. | 361/305 |
| 5,409,862 | 4/1995 | Wada et al. | 437/197 |
| 5,464,786 | 11/1995 | Figura et al. | 437/52 |
| 5,478,772 | 12/1995 | Fazan | 437/60 |
| 5,504,041 | 4/1996 | Summerfelt | 437/235 |
| 5,563,762 | 10/1996 | Leung et al. | 361/301.4 |
| 5,618,746 | 4/1997 | Hwang | 438/3 |
| 5,619,393 | 4/1997 | Summerfelt et al. | 361/321.1 |
| 5,629,236 | 5/1997 | Wada et al. | 438/607 |
| 5,638,319 | 6/1997 | Onishi et al. | 365/145 |
| 5,686,760 | 11/1997 | Miyakawa | 257/751 |
| 5,696,015 | 12/1997 | Hwang | 437/52 |
| 5,744,832 | 4/1998 | Wolters et al. | 257/295 |

(List continued on next page.)

FOREIGN PATENT DOCUMENTS

| | | |
|---|---|---|
| 0 697 717 A1 | 2/1996 | European Pat. Off. |
| WO96/17381 | 6/1996 | WIPO. |

OTHER PUBLICATIONS

U.S. application No. 08/969,803, Lee, filed Nov. 13, 1997.
U.S. application No. 08/969,672, Park et al., filed Nov. 13, 1997.
Itoh et al., "Integration of BST Thin Film for DRAM Fabrication", Integrated Ferroelectrics, vol. 11, 1995, pp. 101–109.

*Primary Examiner*—David Hardy
*Assistant Examiner*—Matthew Warren
*Attorney, Agent, or Firm*—Myers Bigel Sibley & Sajovec

[57] ABSTRACT

A method of fabricating A ferroelectric memory cell composed of an MOS transistor and A ferroelectric capacitor formed over A semiconductor substrate, comprises the steps of forming A contact hole through an insulating layer to form A contact plug to electrically connect the source region of the MOS transistor and the lower electrode of the ferroelectric capacitor, depositing over the contact hole an oxidizable substance layer to combine with the oxygen generated while forming the ferroelectric layer of the ferroelectric capacitor before forming the contact plug in the contact hole, depositing A conductive oxygen compound layer to separate and pass the oxygen to the upper part of the oxidizable substance layer, and forming the contact plug to electrically connect the source region of the MOS transistor and the lower electrode of the ferroelectric capacitor. Preferably, the lower electrode is composed of Pt, the ferroelectric layer of PZT or barium titanate or Rochelle salt, and the upper electrode of Pt or Al. The oxidizable substance layer is composed of A titanium compound, which may be titanium nitride or A mixture of titanium and its nitride. The conductive oxygen compound layer may be composed of ITO, $IrO_2$, $ReO_2$, $RuO_2$ or $MoO_2$, or their compound, or their composite layer.

12 Claims, 9 Drawing Sheets

U.S. PATENT DOCUMENTS

| | | | |
|---|---|---|---|
| 5,773,314 | 6/1998 | Jiang et al. | 438/3 |
| 5,777,356 | 7/1998 | Dhote et al. | 257/295 |
| 5,793,600 | 8/1998 | Fukuda et al. | 361/321.4 |
| 5,798,903 | 8/1998 | Dhote et al. | 361/321.4 |
| 5,807,774 | 9/1998 | Desu et al. | 438/240 |
| 5,838,035 | 11/1998 | Ramesh | 257/295 |
| 5,838,605 | 11/1998 | Bailey | 365/145 |
| 5,856,704 | 1/1999 | Schuele | 257/754 |
| 5,877,062 | 3/1999 | Horii | 438/396 |
| 5,892,255 | 4/1999 | Evans, Jr. et al. | 257/295 |
| 5,918,118 | 6/1999 | Kim et al. | 438/238 |
| 5,918,123 | 6/1999 | Yang | 438/253 |
| 5,923,970 | 7/1999 | Kirlin | 438/240 |
| 5,926,412 | 7/1999 | Evans, Jr. et al. | 365/145 |

FIG. 1

(Prior Art)

FIG. 2

(Prior Art)

FIG. 3

(Prior Art)

STRUCTURE OF A FERROELECTRIC MEMORY CELL AND METHOD OF FABRICATING IT

BACKGROUND OF THE INVENTION

1. Field of the Invention

The present invention relates to the structure of a ferroelectric memory cell, and a method of fabricating it, which particularly adapts to a highly integrated circuit.

2. Description of the Related Art

Generally, the flash memory is a type of nonvolatile memories, which, unlike SRAMs and DRAMs, do not lose their content when the power supply is cut off. It is also rewritable, but suffering short life due to a high voltage required for the writing. On the other hand, the ferroelectric random access memory (FRAM) has been developed to achieve the advantages of both RAM and flash memory, comprising a ferroelectric material which exhibits spontaneous electric polarization (separation of the center of positive and negative electric charge, making one side of the crystal positive and the opposite side negative) that can be reversed in direction by the application of an appropriate electric field. It may work with high speed at low voltage, and does not lose its content when the power supply is cut off.

Figure 1:
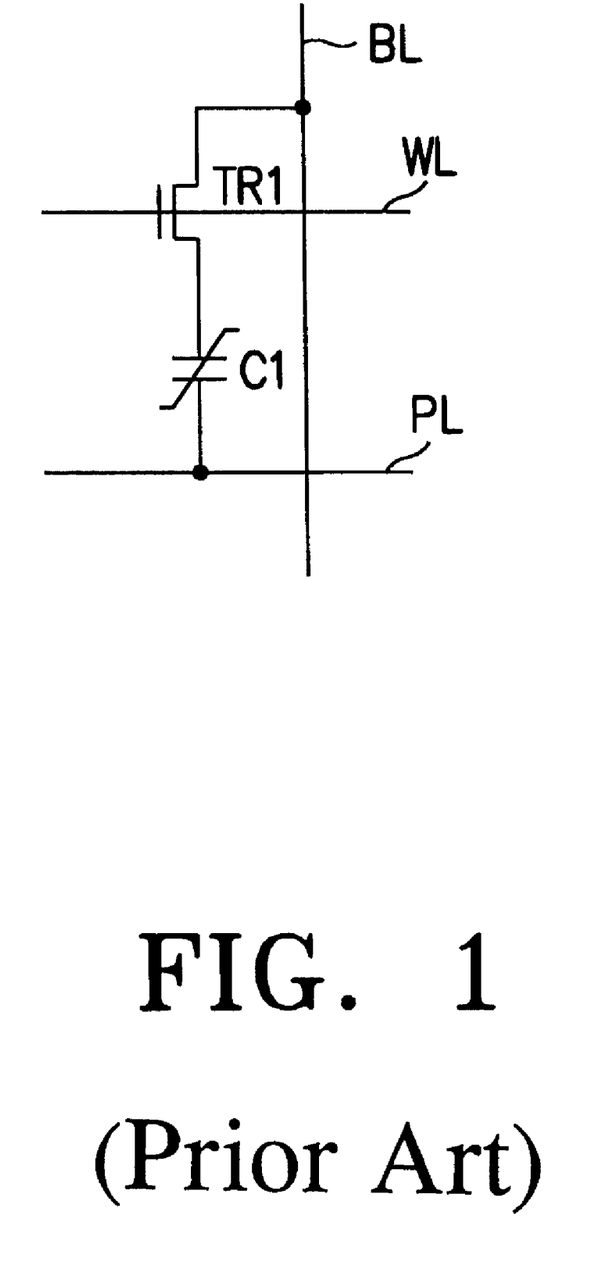
FIG. 1 is an equivalent circuit of a conventional ferroelectric memory cell.

Referring to FIG. 1 for illustrating an equivalent circuit of a conventional FRAM cell, it consists of an NMOS transistor TR1 and a capacitor C1. The gate of the NMOS transistor TR1 is connected with the word line WL, and the drain and source respectively with the bit line BL and one electrode of the capacitor C1. The other electrode of the capacitor C1 is connected with the plate line PL.

Figure 2:
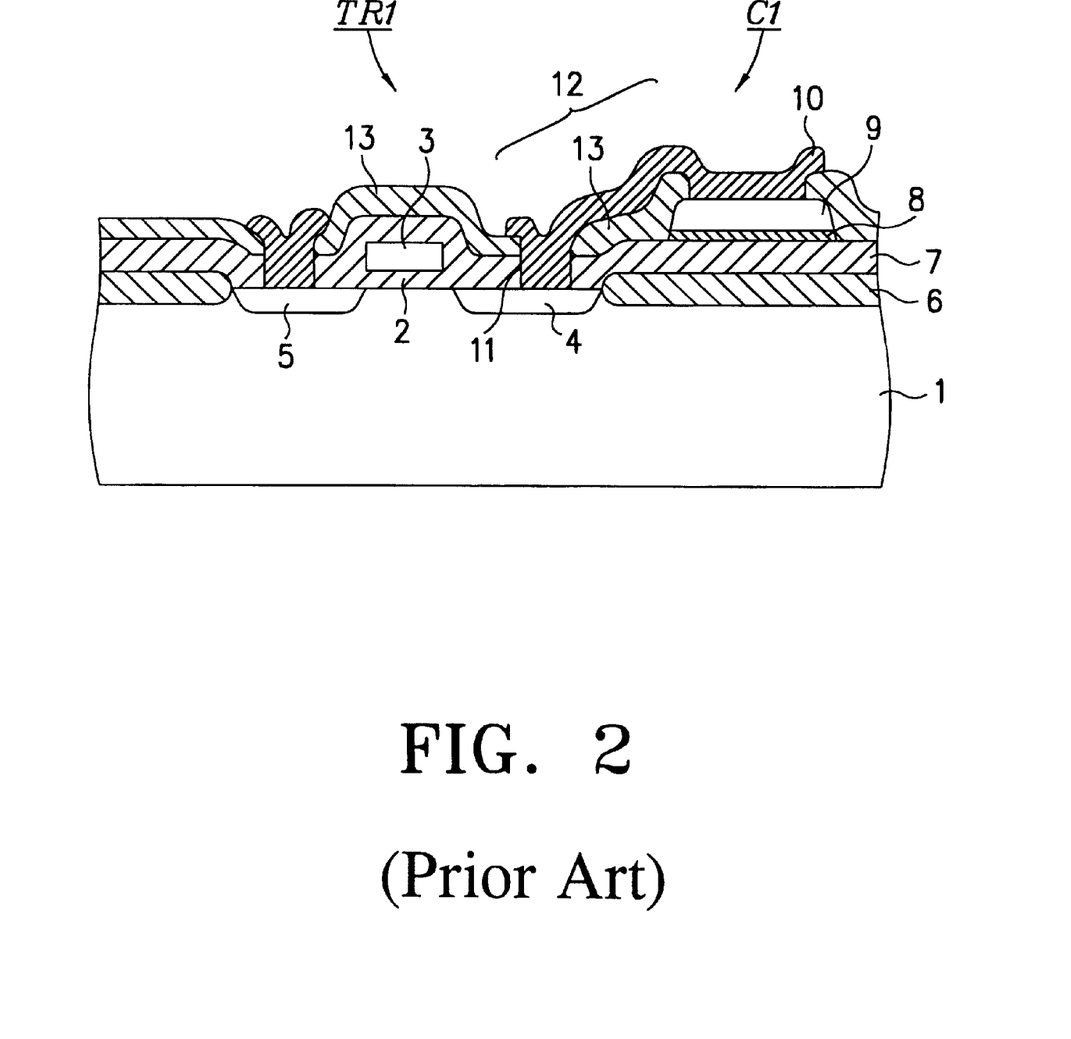
FIG. 2 is a cross sectional view for illustrating the structure of the ferroelectric memory cell as shown in FIG. 1.

Referring to FIG. 2 for illustrating a cross sectional view of the FRAM cell, the NMOS transistor TR1 comprises the gate electrode 3 formed over a gate oxide layer 2 on a p-type silicon substrate 1 and the source and drain regions 4 and 5 self-aligned in the substrate 1. The ferroelectric capacitor C1 comprises a lower electrode 8 of Pt, a ferroelectric layer 9 of lead zirconate titanate (PZT) and an upper electrode 10 of Al, which are formed over an insulating layer 7 on a field oxide layer 6. The source region 4 is electrically connected with the upper electrode 10 via a contact hole 1. There is an insulating layer 13 formed over the transistor TR1. In such conventional FRAM, the fact that the ferroelectric capacitor C1 is formed over the field oxide layer 6 causes restriction of the integrability of the ferroelectric memory cells. In order to resolve this problem, it has been proposed to form the capacitor in the active region in stead of the field oxide region, as shown in FIG. 3.

Figure 3:
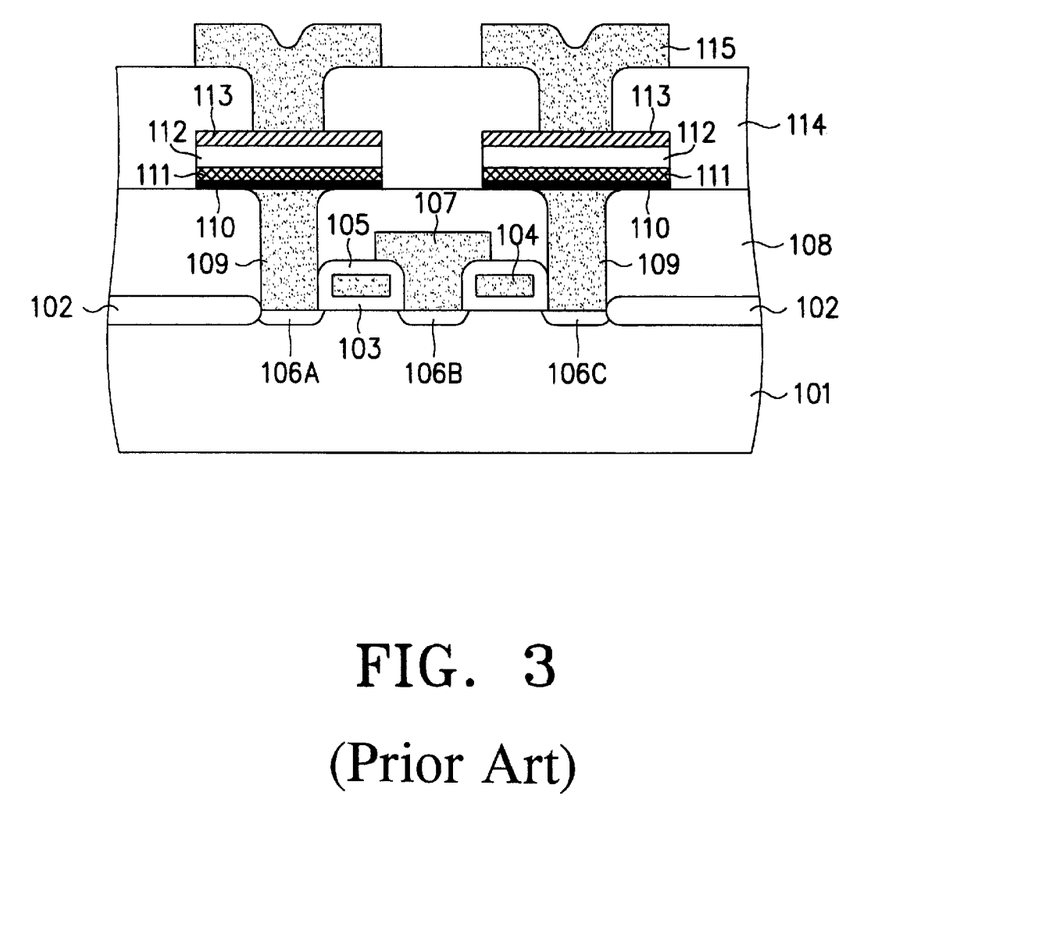
FIG. 3 is a cross sectional view for illustrating the structure of a ferroelectric memory cell according to prior art.

Referring to FIG. 3, the substrate 101 is divided by the field oxide layer 102 into active and non-active regions, including gate oxide layers 103 on which gate electrodes 104 are formed and enclosed by an insulating layer 105. At both sides of the gate electrodes 104 are formed the common drain region 106B and the source regions 106A, 106C to complete the MOS transistors. The common drain region 106B is connected with the bit line 107. The source regions 106A and 106C are electrically connected with the lower electrode 111 of the ferroelectric capacitor via a plug contact 109 formed of a polysilicon or tungsten in specific regions of a first insulating layer 108. The ferroelectric capacitor consists of the lower electrode 111, ferroelectric layer 112 and upper electrode 113. Then, deposited thereon is a second insulating layer 114, which is provided with contact holes to electrically connect the upper electrode 113 with the plate line 115. This serves to enhance the integrability of the memory cells because of the ferroelectric capacitors formed in the active regions. However, when annealing the ferroelectric layer deposited on the active regions in oxygen environment, oxygen molecules are diffused into the polysilicon or tungsten of the lower electrode 111 to form an oxide layer 110 between the lower electrode 111 and the upper surface of the plug contact 109. This results in cutting off the electrical connection between the lower electrode 111 and the plug contact 109, so that the voltage applied to the plate line 115 may be hardly transferred to the source region 106C. This causes the memory cells to malfunction.

SUMMARY OF THE INVENTION

It is an object of the present invention to provide the structure of a ferroelectric memory cell with means for preventing cutting off of the electrical connection between the source region and the lower electrode of the ferroelectric capacitor, and a method therefor.

It is another object of the present invention to provide the structure of a ferroelectric memory cell which may enhance the integrability of the cells together with preventing the opening of electrical contact.

According to an aspect of the present invention, a method of fabricating a ferroelectric memory cell composed of an MOS transistor and a ferroelectric capacitor formed over a semiconductor substrate, comprises the steps of forming a contact hole through an insulating layer to form a contact plug to electrically connect the source region of the MOS transistor and the lower electrode of the ferroelectric capacitor, depositing over the contact hole an oxidizable substance layer to combine with the oxygen generated while forming the ferroelectric layer of the ferroelectric capacitor before forming the contact plug in the contact hole, depositing a conductive oxygen compound layer to separate and pass the oxygen to the upper part of the oxidizable substance layer, and forming the contact plug to electrically connect the source region of the MOS transistor and the lower electrode of the ferroelectric capacitor. Preferably, the lower electrode is composed of Pt, the ferroelectric layer of PZT or barium titanate or Rochelle salt, and the upper electrode of Pt or Al. The oxidizable substance layer is composed of a titanium compound, which may be titanium nitride or a mixture of titanium and its nitride. The conductive oxygen compound layer may be composed of ITO, $IrO_2$, $ReO_2$, $RuO_2$ or $MoO_2$, or their compound, or their composite layer.

According to another aspect of the present invention, a ferroelectric memory cell composed of an MOS transistor and a ferroelectric capacitor consisting of an upper and a lower electrode and a ferroelectric layer therebetween further comprises the conductive oxygen compound layer is disposed between the lower electrode and a contact plug to contact the source region of the MOS transistor and the lower electrode. Preferably, the lower electrode is composed of Pt, the ferroelectric layer of PZT or barium titanate or Rochelle salt, and the upper electrode of Pt or Al. The oxidizable substance layer is composed of a titanium compound, which may be titanium nitride or a mixture of titanium and its nitride. The conductive oxygen compound layer may be composed of ITO, $IrO_2$, $ReO_2$, $RuO_2$ or $MoO_2$, or their compound, or their composite layer.

DETAILED DESCRIPTION OF THE PREFERRED EMBODIMENT

Throughout the attached drawings are used same reference numerals to represent corresponding functional parts.

Figure 4A:
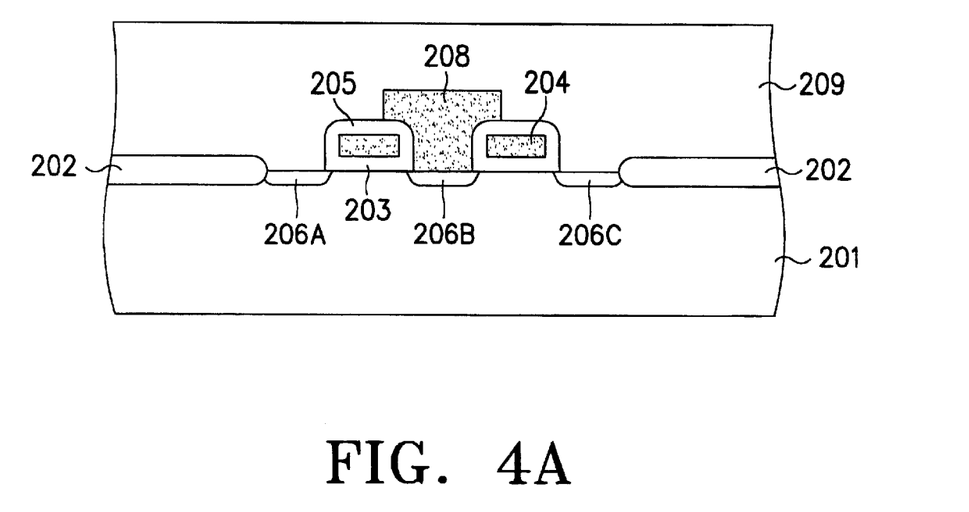
FIGS. 4A to 4D are cross sectional views for illustrating a method of fabricating a ferroelectric memory cell according to a first embodiment of the present invention.

Referring to FIG. 4A, the conventional LOCOS (Local Oxidation of Substrate) process is performed to form the field oxide layers 202 to divide a p-type semiconductor substrate 201 into active and non-active regions. On the active regions are formed gate electrodes 204 with gate oxide layers 203 interposed therebetween. The gate electrode 204 is enclosed by an insulating layer 205. Then, ion implantation is carried out using the gate electrodes 204 as mask to form self aligned common drain regions 206B and source regions 206A, 206C, which regions are n-type. Additionally formed are bit lines 208 connected with the common drain regions 206B, on which is deposited a first insulating layer 209.

Figure 4B:
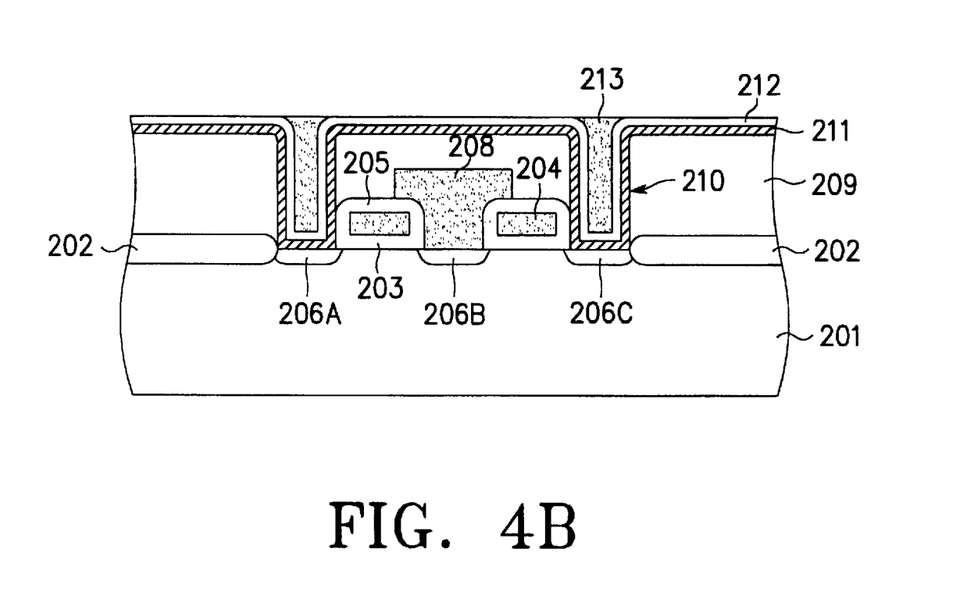

Referring to FIG. 4B, the first insulating layer 209 is subjected to photolithographic process to form contact holes 210 to expose the source regions 206A, 206C of the MOS transistors thus obtained. Sequentially deposited over the first insulating layer 209 having the contact holes 210 are an oxidizable conductive layer 211 and a conductive oxide layer 212, which serve as barrier layers to prevent malfunctioning of the memory cells due to the oxide layer naturally formed by the oxygen generated while annealing the ferroelectric layer of the ferroelectric capacitor in oxygen environment.

The conductive oxide layer 212 may be composed of ITO, $IrO_2$, $ReO_2$, $RuO_2$ or $MoO_2$, or their compound, or their composite layer. The conductive oxide layer 212 is deposited with a thickness of about 500 to 1500 Å by sputtering at a temperature of 200 to 250° C. This oxide layer 212 separates the oxygen diffused during the subsequent annealing of the ferroelectric layer, passing it to the oxidizable conductive layer 211.

The oxidizable conductive layer 211 facilitates the deposition of the conductive oxide layer 212, and prevents the failure generated when the conductive oxide layer 212 directly contacts the source region 206C. The oxidizable conductive layer 211 reacts with the oxygen coming through the conductive oxide layer 212 to form oxide layers. The oxidizable conductive layer 211 is a titanium compound, which may be titanium nitride TiN or a mixture of titanium Ti and its nitride TiN. The oxidizable conductive layer 211 is deposited with a thickness of about 800 Å by sputtering at a temperature of about 60° C. Subsequently deposited over the oxidizable conductive layer 211 and conductive oxide layer 212 is a conductive layer composed of polysilicon, tungsten (W) or TiN, which is then subjected to CMP or etch back process to complete the contact plugs 213.

Figure 4C:
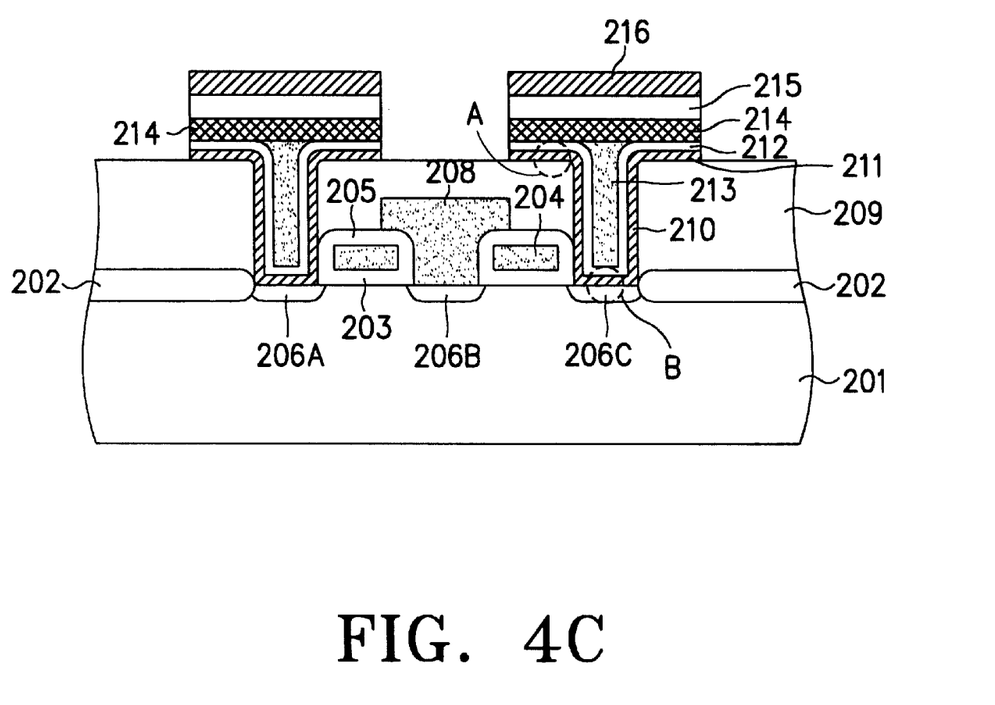

Referring to FIG. 4C, sequentially deposited over the substrate 201 having the contact plugs 213 are a first conductive layer 214 for the lower electrode of the capacitor, ferroelectric layer 215 and a second conductive layer 216 for the upper electrode, which is then patterned to form the ferroelectric capacitor. In this case, the first conductive layer 214 may be composed of Pt, the ferroelectric layer 215 of PZT or barium titanate ($Ba_2TiO_4$) or Rochelle salt (potassium sodium tartrate), and the second conductive layer 216 of Pt or Al.

The ferroelectric layer 215 is deposited by sputtering or chemical vapor deposition, and subjected to annealing process under oxygen atmosphere of about 650° C. for about 30 minutes. The diffusion of oxygen is generated during this annealing. This causes the oxidizable conductive layer 211 to be oxidized in the parts near the diffused oxygen, thus forming the oxide layer as indicated by reference symbol "A" in FIG. 4C. However, the lower region of the contact plug 213 contacting the source region 206C, as indicated by reference symbol "B", is not oxidized because the diffused oxygen does not reach that region. Hence, although the diffused oxygen naturally produces oxide layers in the upper part of the contact plug 213 as well as in the region "A", the first conductive layer 214 and source region 206C are connected together by means of the conductive oxide layer 212 which does not react with oxygen, so that the memory cell may normally work.

Figure 4D:
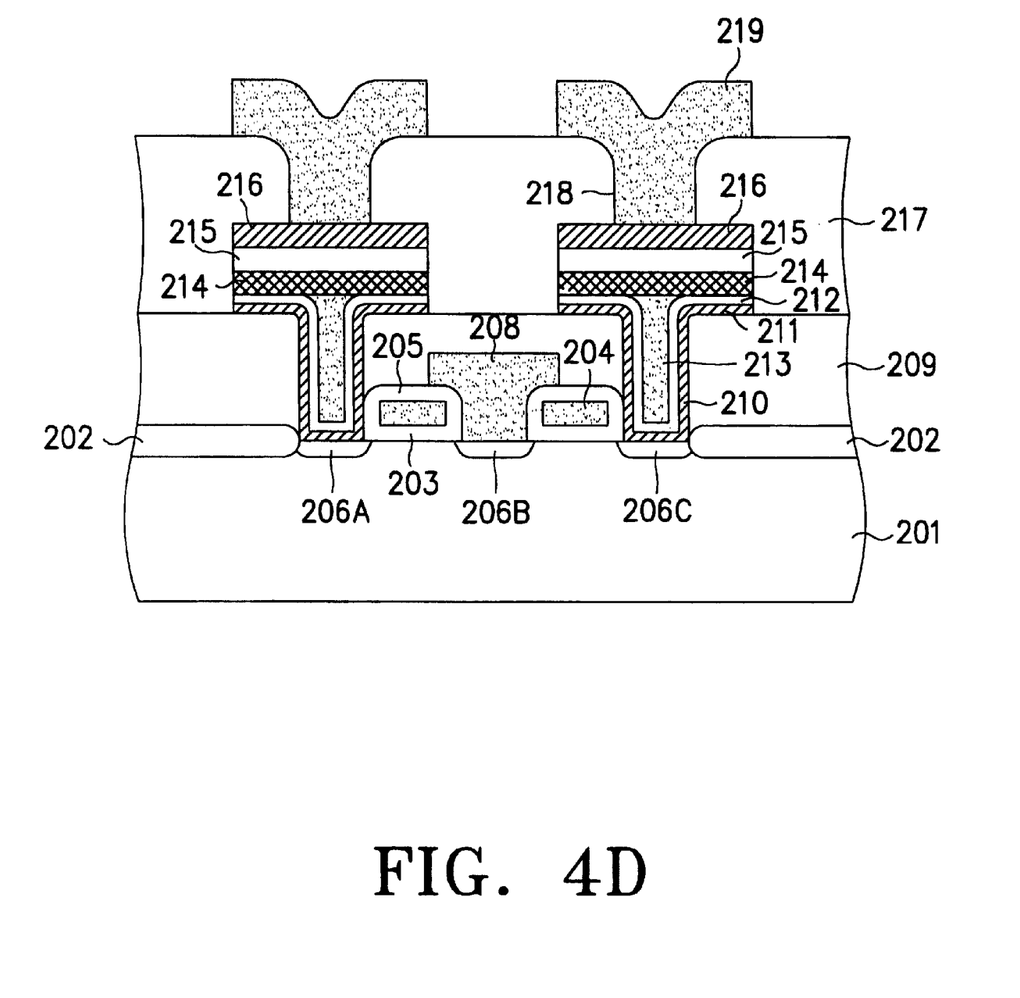

Referring to FIG. 4D, the substrate 201 having the ferroelectric capacitor is applied with a second insulating layer 217, which is then provided with contact holes to connect the upper electrode 216 of the ferroelectric capacitor with the plate line 219, thus completing the ferroelectric memory cell according to the first embodiment of the present invention. As described above, the oxidizable conductive layer 211 and conductive oxide layer 212 are sequentially deposited over the substrate before forming the contact plug to electrically connect the lower electrode 214 and the source region 206C. The conductive oxide layer 212 separates and passes the oxygen generated during the annealing of the ferroelectric layer to the oxidizable conductive layer 211 without reacting with it. Thus, even if there are formed oxide layers in the parts of the oxidizable layer near the upper part of the contact plug 213, the conductive oxide layer 212 serves to electrically connect the first conductive layer 214 with the source region 206C of the MOS transistor, so that the normal operation of the memory cell is secured.

Figure 5:
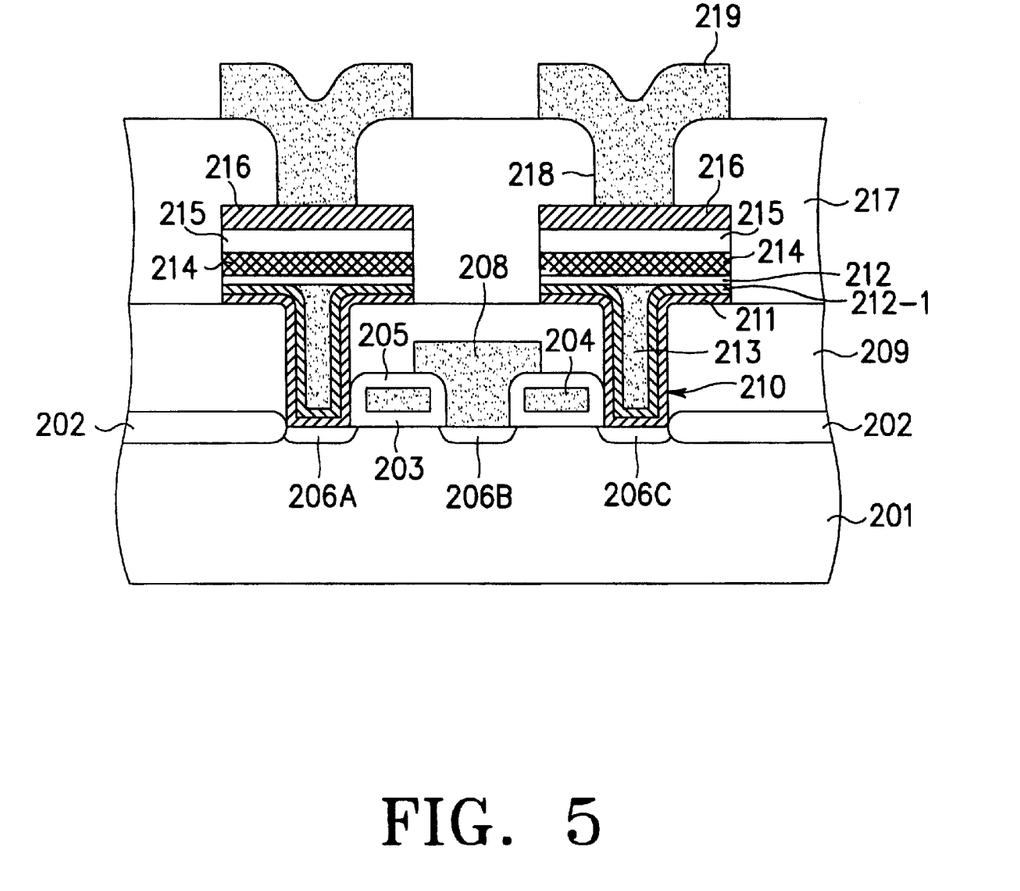
FIG. 5 is a cross sectional view for illustrating the structure of a ferroelectric memory cell achieved by a second embodiment of the present invention.

In the ferroelectric memory cell obtained by the second embodiment of the present invention, as shown in FIG. 5, the MOS transistor and ferroelectric capacitor are achieved through the same process as applied to the previous embodiment. However, the present embodiment is different from the previous embodiment in that another conductive layer 212-1 such as a Pt layer or conductive oxygen compound layer is sequentially deposited over the oxidizable conductive layer 211 to electrically connect the lower electrode 214 of the ferroelectric capacitor with the source region 206C of the MOS transistor. After that, the contact plug 213 is completed on the resultant structure having the conductive layer 212-1, which is composed of conductive material such as polysilicon, tungsten (W) or TiN, and then the conductive oxide layer 212 is formed thereon. Here, the conductive oxide layer 212 serves as an adhesive layer for connecting the conductive layer 212-1 with the first conductive layer 214 to be formed in the sequential process.

When the conductive layer 212-1 is composed of the oxygen compound layer, it is deposited with a thickness of about 500 to 1500 Å by sputtering at a temperature of 200 to 250° C. Further, when the conductive layer 212-1 is composed of the Pt layer, it is deposited with a thickness of about 1500 Å by the chemical vapor deposition (CVD). The conductive oxide layer 212 may be composed of, as in the previous embodiment, ITO, $IrO_2$, $ReO_2$, $RuO_2$ or $MoO_2$, or their compound, or their composite layer, and deposited with a thickness of about 500 to 1500 Å by sputtering at a temperature of about 200 to 250° C.

According to the second embodiment of the present invention as stated above, as in the previous embodiment, even if the diffused oxygen generated during the formation of the feffoelectric layer reacts with the parts of the oxidizable oxide layer near the upper part of the contact plug to form oxide layers, the conductive layer 212-1 and the conductive oxide layer 212 serve enough to electrically connect the first conductive layer 214 with the source region 206C of the MOS transistor, so that the memory cell may normally work.

Figure 6:
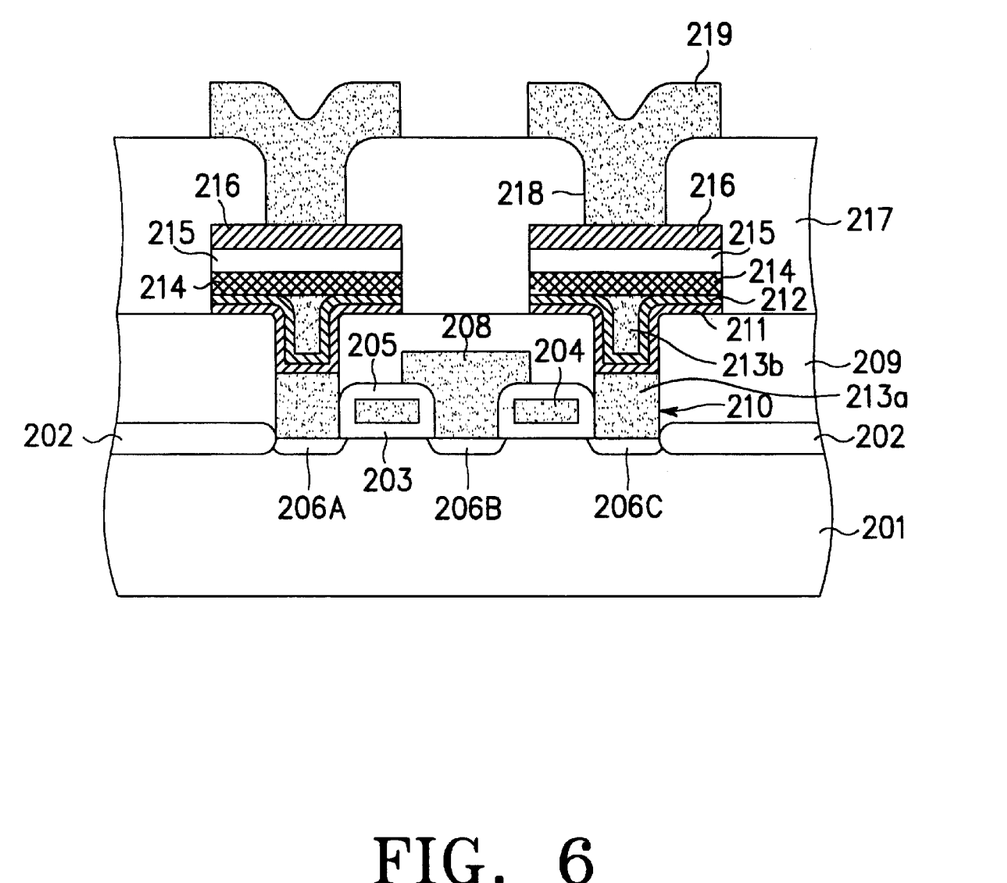
FIG. 6 is a cross sectional view for illustrating the structure of a ferroelectric memory cell achieved by a third embodiment of the present invention.

FIG. 6 is a cross sectional view for illustrating the structure of a ferroelectric memory cell achieved by a third embodiment of the present invention. The conventional problem can be solved through the third embodiment thereof, such as a void generated when an aspect ratio of the contact hole having the contact plug is large.

After forming the contact hole 210 to expose the source regions 206A and 206C of the MOS transistor by the same process as the first embodiment, a first contact plug 213a is formed through filling the conductive material such as polysilicon, tungsten (W), or TiN in the contact hole 210 up to nearly or about half the depth, as shown in FIG. 6. Sequentially, the oxidizable conductive layer 211 and the conductive oxide layer 212 are formed by the same process as the first embodiment. The second contact plug 213b is then formed to completely fill the contact hole 210 to thereby complete the ferroelectric memory cell.

According to the third embodiment of the present invention as stated above, even if the diffused oxygen generated during formation of the ferroelectric layer reacts with the parts of the oxidizable oxide layer near the upper part of the contact plug to form oxide layers, the memory cell may normally work because of the conductive oxide layer 212. Further, it has an effect in that the stable contact hole can be obtained through forming the first contact plug for filling the contact hole up to nearly or about half the depth.

Figure 7:
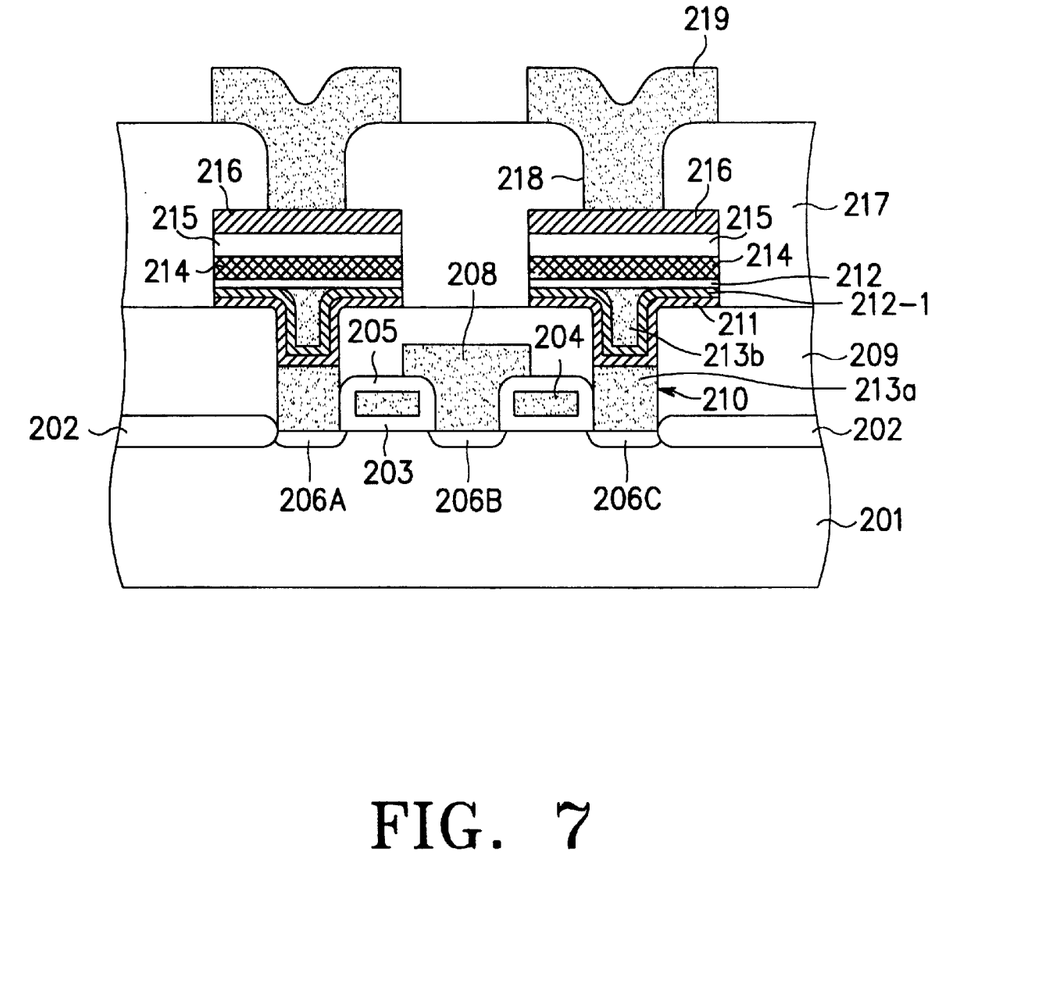
FIG. 7 is a cross sectional view for illustrating the structure of a ferroelectric memory cell achieved by a fourth embodiment of the present invention.

FIG. 7 is a cross sectional view for illustrating the structure of a ferroelectric memory cell achieved by a fourth embodiment of the present invention. The conventional problem such as a void can be also solved through the fourth embodiment thereof.

After forming the contact hole 210 by the same process as the second embodiment, the first contact plug 213a is formed through filling the conductive material such as polysilicon, tungsten (W), or TiN in the contact hole 210 up to nearly or about half the depth. The oxidizable conductive layer 211 and the conductive oxide layer 212-1 are formed sequentially. After that, the second contact plug 213b is formed to completely fill the contact hole 210 and then the conductive oxide layer 212 and the ferroelectric capacitor are formed to thereby complete the ferroelectric memory cell.

According to the fourth embodiment of the present invention as stated above, even if the diffused oxygen generated during formation of the ferroelectric layer reacts with the parts of the oxidizable oxide layer near the upper part of the contact plug to form oxide layers, the memory cell may normally work because of the conductive layer and conductive oxide layer. Further, it has an effect in that the stable contact hole can be obtained through forming the first contact plug for filling the contact hole-up to nearly or about half the depth.

While the present invention has been described with specific embodiments accompanied by the attached drawings, it will be appreciated by those skilled in the art that various changes and modifications may be made thereto without departing the gist of the present invention.

What is claimed is:

1. An integrated circuit capacitor, comprising:

a semiconductor substrate;

a first electrically insulating layer on said semiconductor substrate, said first electrically insulating layer having a contact hole therein that exposes a portion of said semiconductor substrate;

a first conductive layer comprising a first material and lining a sidewall of the contact hole and extending over the exposed portion of said semiconductor substrate;

a second conductive layer comprising at least one of a second material selected from a first group consisting of conductive oxides and platinum directly on the first conductive layer, said second conductive layer extending opposite the sidewall of the contact hole;

a first electrically conductive contact plug in the contact hole, said first electrically conductive contact plug extending on said second conductive layer and comprising a third material that is not within the first group;

a first capacitor electrode comprising a fourth material which is different from the third material, said first capacitor electrode extending on said second conductive layer and on said first electrically conductive contact plug;

a capacitor dielectric on said first capacitor electrode; and a second capacitor electrode on said capacitor dielectric.

2. The integrated circuit capacitor of claim 1, wherein the first material comprises titanium and/or nitride thereof; and wherein the third material comprises a conductive material selected from a second group consisting of polysilicon, tungsten and titanium nitride.

3. The integrated circuit capacitor of claim 2, wherein the first group consists of ITO, $IrO_2$, $ReO_2$, $RuO_2$ and $MoO_2$.

4. The integrated circuit capacitor of claim 1, wherein the first group consists of ITO, $IrO_2$, $ReO_2$, $RuO_2$ and $MoO_2$.

5. The integrated circuit capacitor of claim 4, wherein the first capacitor electrode comprises platinum.

6. The integrated circuit capacitor of claim 5, wherein said capacitor dielectric comprises a ferroelectric material selected from a third group consisting of PZT, barium titanate and Rochelle salt.

7. The integrated circuit capacitor of claim 1, further comprising an intermediate conductive oxide layer disposed between said second conductive layer and said first capacitor electrode.

8. The integrated circuit capacitor of claim 7, wherein said intermediate conductive oxide layer is disposed between said first electrically conductive contact plug and said first capacitor electrode.

9. The integrated circuit capacitor of claim 8, further comprising a second electrically conductive contact plug comprising the third material disposed in the contact hole, said second electrically conductive contact plug extending between said first conductive layer and said semiconductor substrate.

10. The integrated circuit capacitor of claim 1, further comprising a second electrically conductive contact plug comprising the third material disposed in the contact hole, said second electrically conductive contact plug extending between said first conductive layer and said semiconductor substrate.

11. The integrated circuit capacitor of claim 2, further comprising a second electrically conductive contact plug comprising the third material disposed in the contact hole, said second electrically conductive contact plug extending between said first conductive layer and said semiconductor substrate.

12. The integrated circuit capacitor of claim 7, further comprising a second electrically conductive contact plug comprising the third material disposed in the contact hole, said second electrically conductive contact plug extending between said first conductive layer and said semiconductor substrate.

\* \* \* \* \*